United States Patent [19]

Wong et al.

[11] Patent Number: 5,224,125
[45] Date of Patent: Jun. 29, 1993

[54] DIGITAL SIGNED PHASE-TO-FREQUENCY CONVERTER FOR VERY HIGH FREQUENCY PHASE LOCKED LOOPS

[75] Inventors: Hee Wong; Tsun-Kit Chin, both of San Hose, Calif.

[73] Assignee: National Semiconductor Corporation, Santa Clara, Calif.

[21] Appl. No.: 681,095

[22] Filed: Apr. 5, 1991

[51] Int. Cl.⁵ .............................................. H03D 3/18
[52] U.S. Cl. ..................................... 375/82; 329/307; 375/119
[58] Field of Search .................... 375/82, 118, 81, 119, 375/80; 329/304, 307, 309, 310; 328/141

[56] References Cited

U.S. PATENT DOCUMENTS

| | | | |
|---|---|---|---|
| 4,019,153 | 4/1977 | Cox, Jr. et al. ...................... | 331/1 A |
| 4,295,098 | 10/1981 | Crowley ............................... | 328/24 |
| 4,374,438 | 2/1983 | Crowley ............................... | 455/265 |
| 4,682,116 | 7/1987 | Wolaver et al. . | |
| 4,821,293 | 4/1989 | Shimizume et al. . | |
| 5,056,054 | 11/1991 | Wong et al. ...................... | 375/119 X |

OTHER PUBLICATIONS

AT&T Advance Data Sheet, "T7351 FDDI Physical Layer Device", Sep. 1990.

*Primary Examiner*—Curtis Kuntz
*Assistant Examiner*—Tesfaldet Bocure
*Attorney, Agent, or Firm*—Townsend and Townsend Khourie and Crew

[57] ABSTRACT

A signed phase-to-frequency ('P-to-F') converter for use in a very high frequency Phase Locked Loop is disclosed. The P-to-F converter receives an input signal indicating plus/minus phase errors and an enable signal. The input signal is converted into a count by a counting circuit. An upper part of the count signal is used to generate a 3-phase sawtooth digital pattern. A lower part of the count is converted by a lower-bit pulse density modulation ('PDM') circuit to generate a signal indicating the binary weight of the lower part of the count. The output of the lower-bit PDM circuit is applied, along with the 3-phase digital pattern, to three higher-bit PDM circuits. The carry output of the higher-bit PDM circuits is the digital output of the P-to-F converter and is converted from a digital to an analog signal by RC filters. The positive and negative phase error is indicated by the leading/lagging phase among the 3-phase output waveforms.

6 Claims, 9 Drawing Sheets

* VALUES OF RC ARE APPLICATIONS DEPENDENT
  (DEPEND ON LOOP FILTER AND MAX 1 OF P_F CONVERTER)
** 74HC86 (BN17) IS POWERED FROM ANALOG VCC (+5V)

FIG. 10'''

KEY TO FIG. 10

DIGITAL SIGNED PHASE-TO-FREQUENCY CONVERTER FOR VERY HIGH FREQUENCY PHASE LOCKED LOOPS

BACKGROUND OF THE INVENTION

This invention relates to the field of high frequency Phase Locked Loops ('PLL's) and, in particular, to digital or quasi-digital PLLs.

Many attempts to fabricate very high frequency (100 MGz+) PLLs as integrated circuits ('IC's) have been made. Although some high frequency PLLs have been successfully fabricated as ICs, traditional analog PLLs are difficult to fabricate as ICs as the PLL requires many analog circuit elements and interactive resistor-capacitor ('RC') time-constants. Due to process variations, these analog IC PLLs tend to have a great deal of variation in their performance specifications. Additionally, conventional digital PLLs require a clock frequency many times higher than the PLLs' operating frequency in order to achieve acceptable phase resolutions. This requirement for a high frequency block, which may need to operate at frequencies higher than 1 GHz, has limited the use of digital PLLs in very high speed applications.

Figure 1:
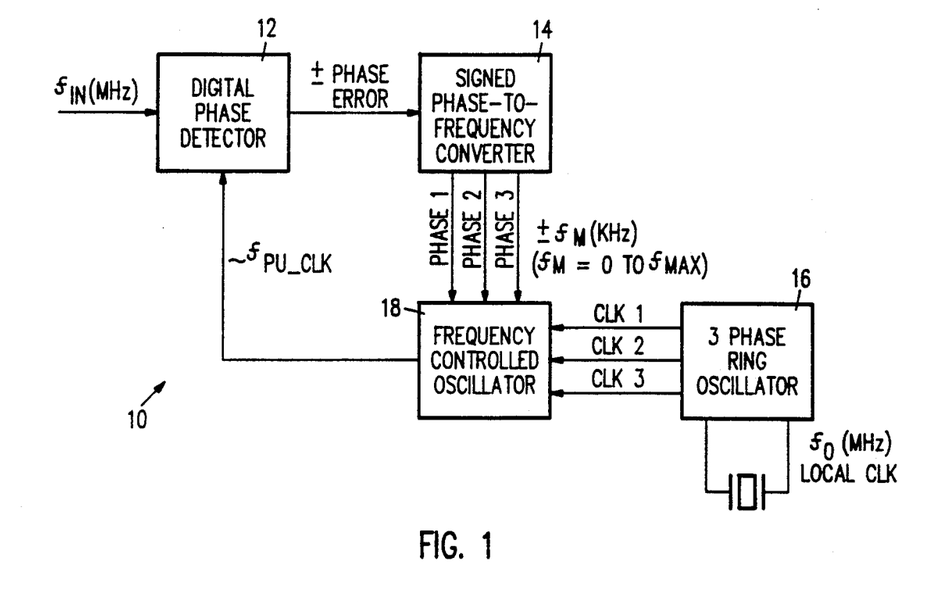
FIG. 1 is a block diagram of a PLL containing the present invention.

A new method and apparatus for implementing a quasi-digital high frequency PLL is shown in FIG. 1. Digital PLL 10 comprises, in this embodiment, phase detector 12, signed phase-to-frequency ('P-to-F') converter 14, 3-Phase ring oscillator 16 and Frequency-Controlled Oscillator ('FCO') 18. The use of FCO 18 and P-to-F converter 14 allows the use of a clock frequency which is no higher than the generating frequency of the PLL to achieve acceptable phase resolution.

The technique and apparatus shown in FIG. 1 requires signed P-to-F converter 14 to convert the phase error information generated by phase detector 12, which is in the form of UP, DOWN and HOLD, to multiphase analog waveforms to drive FCO 18. The output frequency of P-to-F converter 14 determines the locking range of PLL 10 ($f_{in} = f_{PLL-CLK} = f_{Local\ CLK} \pm f_m$, where $f_m$ is the output frequency of the P-to-F converter). The phase error direction, either plus or minus, is represented by the phase relationship, either leading or lagging, of the multi-phase outputs from P-to-F converter 14 (Phases 1, 2, and 3), which FCO 18 interprets as either an increase in the operating frequency or a decrease in the operating frequency.

Known methods to create a digital multi-phase P-to-F converter was complicated state machines to perform the necessary signal conversion and waveform synthesis, followed by digital-to-analog converters and anti-aliasing filters. This approach is not cost-effective and requires the fabrication of many precision analog circuits, which cannot be done with sufficient consistency. A digital P-to-F converter of simpler design would be a significant advance on known digital P-to-F converter, especially where high frequency operation is needed.

SUMMARY OF THE INVENTION

In a preferred embodiment, the present invention comprise a P-to-F converter capable of very high frequency PLL operation. As input, the P-to-F converter receives a phase signal, indicating +/phase error, and an enable signal. In response to these digital inputs, an up/down counting circuit converts the phase information to a frequency quantity. The most significant bits ('MSB's) of the up/down counting circuit are applied to a 3-Phase waveform generator. The Least Significant Bits ('LSB's) are applied to a 4-bit pulse density modulation ('PDM') circuit, which generates an output signal, whose pulse density is dependent upon the signal received from the up/down circuit. As the LSBs of each of the 3-Phase Patterns are identical, only one LSB PDM circuit is needed for the three digital patterns.

After the up/down counting signal has been transformed into a 3-Phase Pattern and the LSBs have been processed by the LSB PDM, each of the three 3-phase Patterns is simultaneously processed, along with the carry output from the LSB PDM circuit, by 3 separate 2-bit MSB PDM circuits. The digital output from the MSB PDM circuits are buffered and then processed by three matched RC filters, converting the digital output to analog signals.

The preferred embodiment, as well as possible modifications and alternations, will now be described with reference to the drawings listed and described below.

DESCRIPTION OF THE SPECIFIC EMBODIMENT

Figure 2:
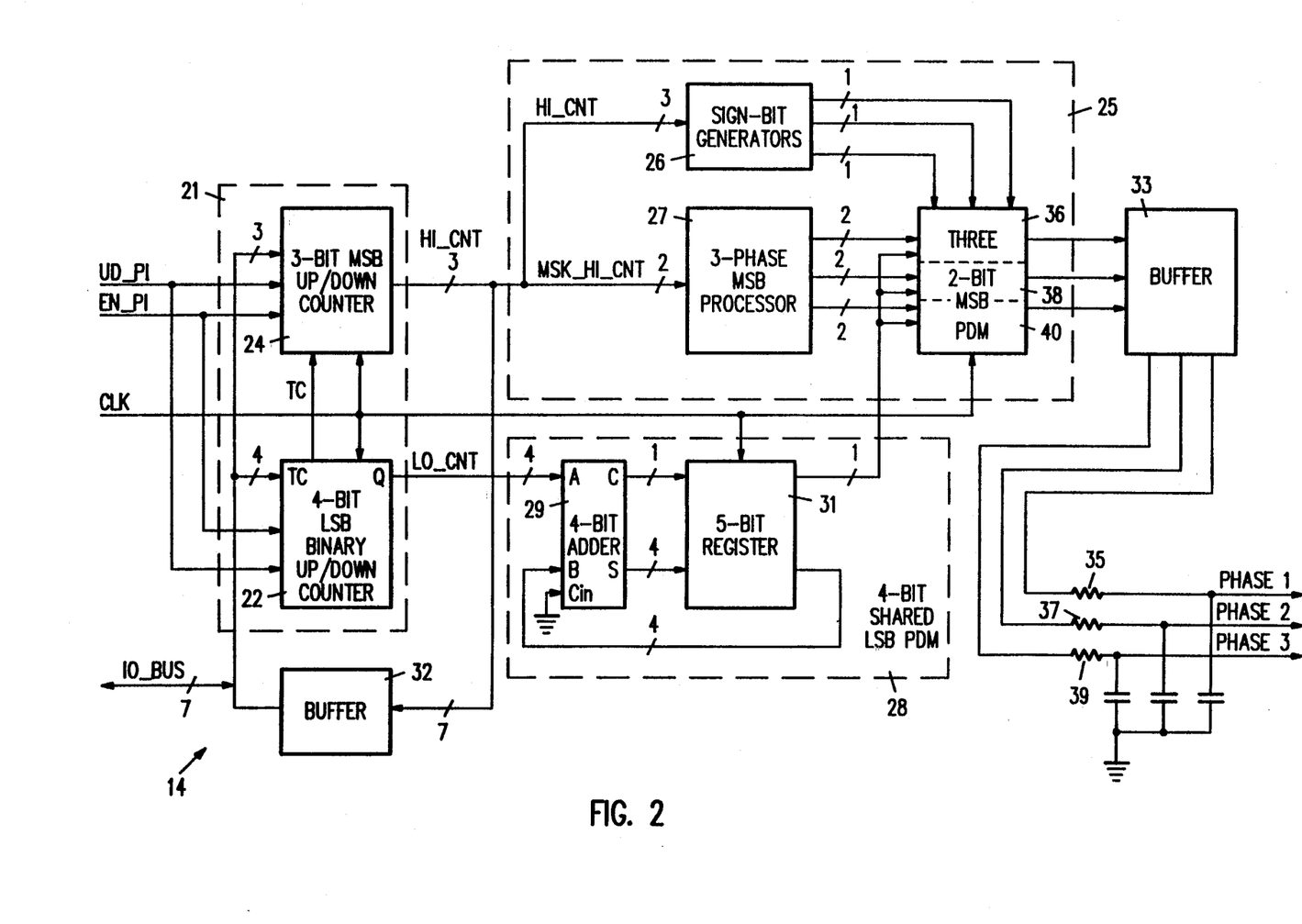
FIG. 2 is a block diagram of a preferred embodiment of the present invention.

FIG. 2 is a simplified block diagram of a preferred embodiment of the present invention, implemented to provide a 3-Phase output. P-to-F converter 14 receives two signals, an up/down signal and an enable signal. The +/Phase error quantities are represented by the up/down signal, and the enable signal provides a "hold" state. Up/down counter 21 receives the phase error signal and the enable. During periods when the phase error is positive and the enable signal is active, counter 21 increments its output. During periods when the phase error is negative and enable is active, counter 21 decrements its output. When the enable signal is inactive, counter 21's output remains constant as its previous level. The output of counter 21 is the cumulative current value of the decrements, increments, and holds at any given point in time.

Up/down counter 21 produces a 7-bit output signal. The three MSBs generated by 3-bit MSB up/down counter 24 are transmitted to 3-phase waveform generator 25. The mathematical calculations necessary to transform the 3-bit input has a 3-phase Pattern are described in detail below. The phase relationship of the 3-phase waveforms, either leading or lagging, represents the positive and negative frequencies, relative to the normal frequency of operation.

After the 3-phase Patterns are generated by MSB Processor 27, the 3-Phase Patterns are transmitted to 3 2-bit PDM modulators 36, 38 and 40. Previously, the 4 LSBs generated by 4-bit LSB up/down counter 22 were transmitted to a 4-bit PDM circuit 28. PDM circuit 28 comprises 4-bit adder 29 and 5-bit register 31. As shown in FIG. 2, the 5-bit output of adder 29 is connected to the input of 5-bit register 31. Each of PDM circuits 36, 38, and 40 also comprises an adder and register (not illustrated) coupled in a similar fashion to PDM circuit 28. PDM is performed in this invention by recursively adding the input of the PDM adder to the output of the PDM register. For example, in circuit 28, the 4-bit input on adder 29 is added to the 4-bit LSB output of register 31 which stores the results of the previous addition of adder 29. The output of each iteration appears on the carry-out output of register 31. In the preferred embodiment, the carry-out output of PDM modulator 28 is transmitted to the carry input of each of PDM circuits 36, 38 and 40. The Pulse density of the adders's final carry output reflects the binary weighting of the digital code received by the PDM circuits. The final outputs from PDM circuits 36, 38 and 40 are transmitted to buffer 33 and thence to RC filters 35, 37, and 39, which transform the digital signal to an analog one.

As shown in FIG. 2, phase error information from a phase detector is conveyed to P-to-F converter 14 through two logic inputs labelled UD_PI and EN_PI. EN_PI acts as a flag, indicating the presence of a phase error. The two stairs of UD_PI represent the direction of the phase error, either +1 or −1.

Figure 3:
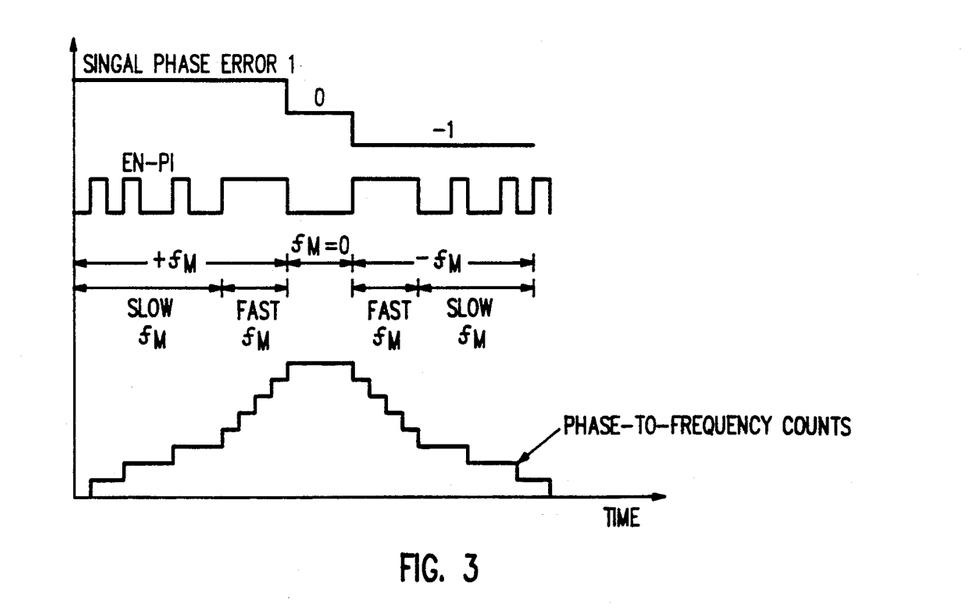
FIG. 3 illustrates the value of the integer represented by the up-down counting circuit 7 bit output in response to the phase error and enable inputs.

In response to the sign of the phase error (UD_PI) and the phase error flag (EN_PI), up/down counter 21 accumulates positive or negative counts, each count representing a unit error. As shown in FIG. 2, up/down counter 21 is made up of 4-bit LSB counter 22 whose output is the 4-bit LO_CNT and 3-bit MSB counter 24, whose 3-bit output is HI_CNT. UD_PI controls the counting direction and EN_PI enables the counter. As shown in FIG. 3, the output of up/down counter 21 is a sawtooth Pattern with unit steps.

Figure 4:
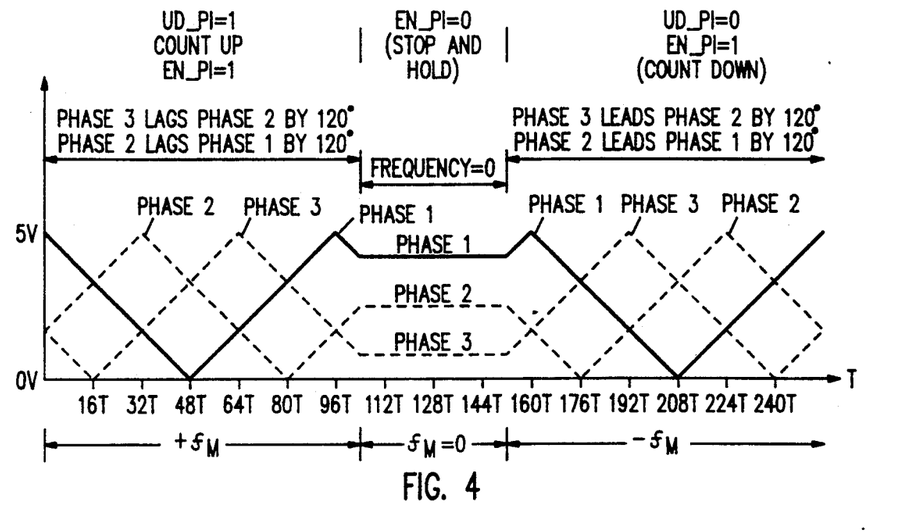
FIG. 4 illustrates a 3-phase triangular wave and its phase relationships.

A waveform synthesizer 25 (FIG. 2) is used to convert the output of up/down counter 24 and PDM 28 to a group of pulse density modulated triangular waveforms which after integration by RD circuits 35, 37, and 39 are used by FCO. The phase relationship among the multi-phase outputs (leading or lagging) is interpreted as positive or negative frequencies by the FCO. This is illustrated in FIG. 4, where a 3-Phase triangular wave is drawn and the phase relationship between the waves is noted.

Instead of triangular Patterns, the 3-Phase digital patterns generated in the present invention take the form of a sawtooth digital pattern. This allows the multi-phase waveform generators to share circuitry with both counter 21 and the PDM circuits. The 'triangular' waveform used herein can be obtained by a simple PDM inversion, once the sawtooth pattern has been generated.

Figure 5:
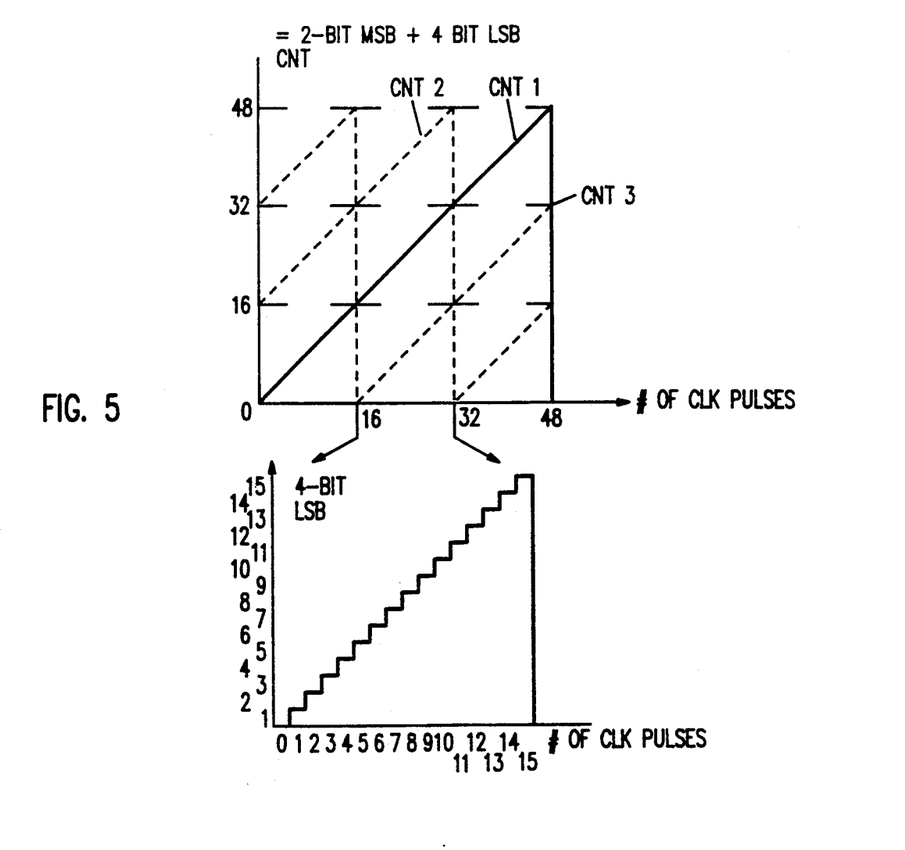
FIG. 5 shows how the LSBs of a 3-Phase sawtooth Pattern are shared in common.

Multi-phase sawtooth patterns have the unique advantage that they share the same counting direction among the different phases. As shown in FIG. 5, for a group of n-phase signals, one cycle of the sawtooth pattern is divided into n slots, denoted in the figure as the number of clock pulses. Each pattern can be described using the same LSBs but with different offsets for the MSBs. As a result, the same 4-bit LO_CNT output generated by counter 21 can share the common LSB PDM circuit for each of the multi-phase waveforms. By contrast, the opposite counting directions used in multi-phase triangular patterns make the sharing of the PDM circuits, even for the LSBs, impractical.

To generate a group of N-phase sawtooth patterns, each cycle of the sawtooth digital pattern is divided into n slots defined by an m-bit MSB (m is the smallest integer such that $2^m \geq$. Incrementing the MSB by one represents a precise 360°/m phase shift, or 360°/2n for the case of a triangular pattern. By repeating this process n times, n-phase patterns can be obtained.

Two sawtooth cycles are required to construct one cycle having a triangular output pattern. Counter 21 thus must generate m+1 bits to describe the multi-phase triangular patterns completely. For a 3-phase sawtooth pattern, a two bit MSB designated MSK_HI_CNT is needed to divide one cycle into three slots (n=3, m=2). The MSBs generated by counter 21 (HI_CNT) are thus 3 bits wide (2+1). HI_CNT is used to generate the signal bits for the 3-phase patterns in a manner that will be described hereafter. The counting sequence for HI_CNT is "0—1—2—4—5—6" when counting up and "6—5—4—2—1—0" when counting down.

MSK_HI_CNT is derived from HI_CNT in the manner shown in equation (1) below:

$$\text{MSK\_HI\_CNT} = \text{HI\_CNT and 3} \qquad (1)$$

Adding one to MSK_HI_CNT results in a precise 60° phase shift (360°/{2×3}) for the triangular patterns. If the waveform is inverted, as for the case of Phase 2, it represents a 120° phase shift. A Module function (base 3) acts on the sum to keep the 2-bit MSBs (PHSE 1, PHSE2, and PHSE3) of the 3-Phase patterns within the valid states of 0, 1, and 2.

Figure 6:
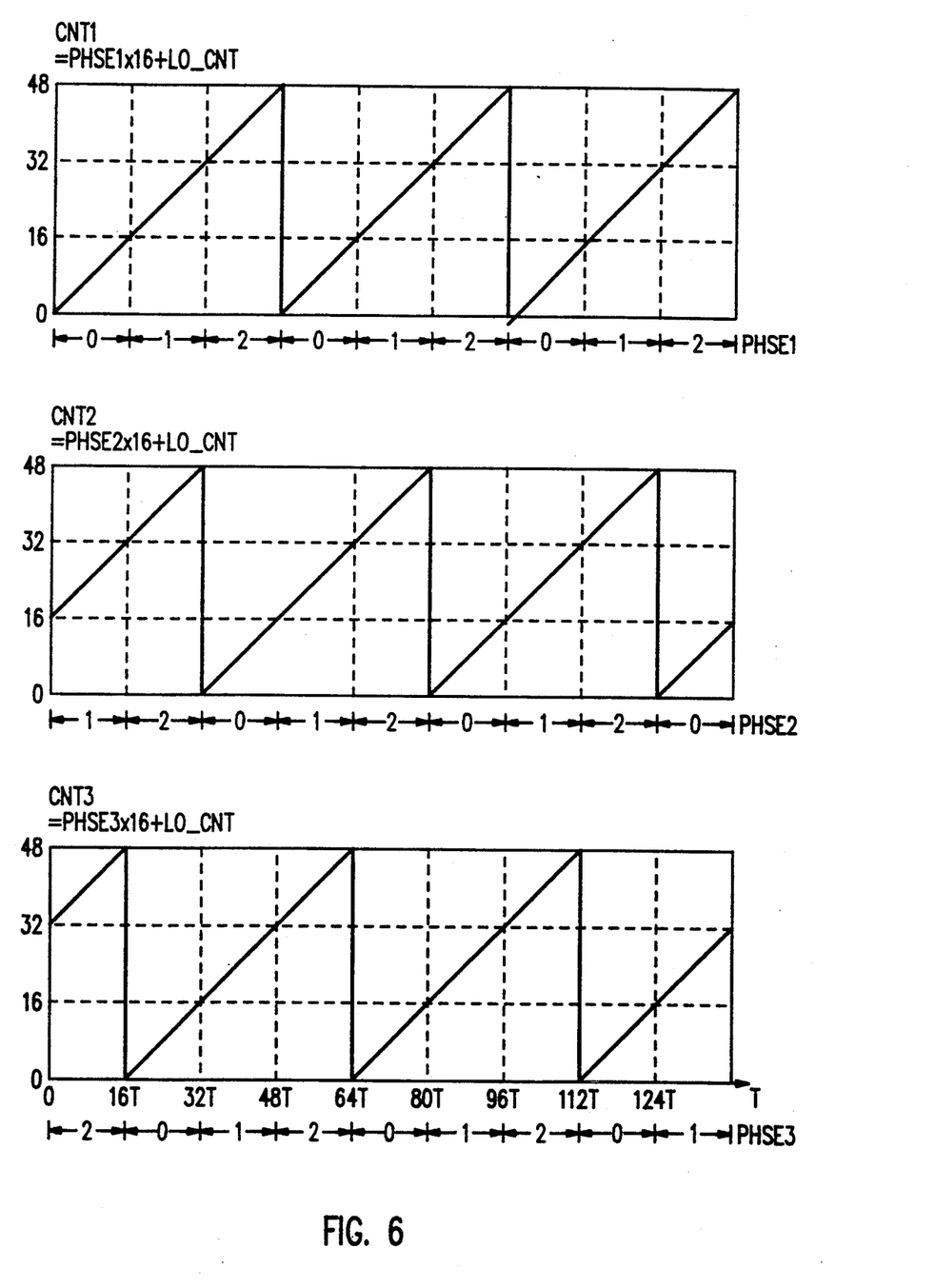
FIG. 6 shows how the 3-phase sawtooth Pattern is generated using MSB processing techniques.

Equation 2 through 7 below describe the 2-bit MSB processing. A pictorial representation of the process is shown in FIG. 6.

$$\text{PHSE1} = \text{MOD}_3\{\text{MSK\_HI\_CNT} + 0\} \qquad (2)$$

$$\text{PHSE2} = \text{MOD}_3\{\text{MSK\_HI\_CNT} + 1\} \qquad (3)$$

$$\text{PHSE3} = \text{MOD}_3\{\text{MSK\_HI\_CNT} + 2\} \qquad (4)$$

$$\text{CNT1} = \text{PHSE } 1 \times 16 + \text{LO\_CNT} \qquad (5)$$

$$\text{CNT2} = \text{PHSE } 2 \times 16 + \text{LO\_CNT} \qquad (6)$$

$$\text{CNT3} = \text{PHSE3} \times 16 + \text{LO\_CNT} \qquad (7)$$

In equations 2 through 7, LO_CNT is the 4bit shared LSB, PHSE1, PHSE2 and PHSE3 are the 2-bit MSBS with unit weighting of 16 (LO_CNT=4 bits), CNT 1, CNT 2 and CNT 3 are the 3-phase sawtooth codes, and $\text{MOD}_3(x)$ is the modulus (base 3) of x. A reset input (T-CLR2) is provided to assure consistent output sequence upon power up during testing.

Figure 7:
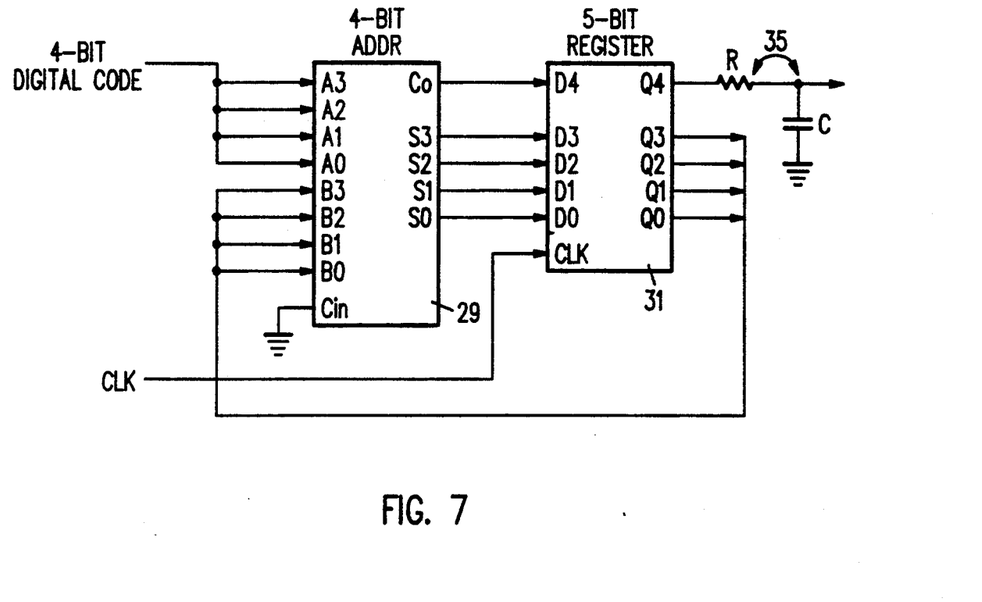
FIG. 7 is a block diagram of a 4-bit Pulse Density Modulator.

PDM is used extensively in the present invention to provide digital to analog conversions. The use of PDM eliminates the need for many analog circuits having precision components such as resistors or capacitors. Also, the digital nature of the PDM circuit is highly immune to system noise. A block diagram of the 4-bit PDM circuit 28 used herein, comprising 4-bit adder 29 and, 5-bit register 31, is shown in FIG. 7. PDM as used herein is a recursive accumulating process for the input digital code, accumulation occurring at a rate defined by the system clock ('CLK'). The pulse density of the adder's carry output, reflects the binary weighting of the received digital code.

Each of the 3-Phase sawtooth patterns illustrated in FIG. 6 can be described by a 2-bit MSB (derived from the two LSBs of HI_CNT) and a 4-bit common LSB (LO_CNT). As shown in FIG. 2, the MSB PDM converters for each phase are 2-bits wide and share a common carry output from 4-bit LO CNT PDM circuit 28. A total of 10 PDM circuits ($3 \times 2 \times 4$) are thus needed, as compared with 18 ($3 \times 6$) if triangular patterns were used. This method thus saves the use of 8-bit adders and their associated registers.

The frequency of occurrence of the PDM's carry output, after being integrated by an RC filter, reflects the binary weighting of the received digital code. When the carry output is active-high, the analog output voltage is proportional to the binary weighting of the input digital code. When the carry is active-low, the analog voltage becomes inversely proportional to the binary weighting of the code. A logic inversion of the PDM's carry bit thus results in an analog voltage inversion after RC integration.

By alternating the inversion of the PDM's carry output over two consecutive cycles of the sawtooth pattern, one cycle of triangular waveform is generated. The sign-bits of the multi-phase patterns define the timings for PDM inversions. HI_CNT of counter 21 is used by sign-bit generator 26 to generate the sign-bits.

Figure 8:
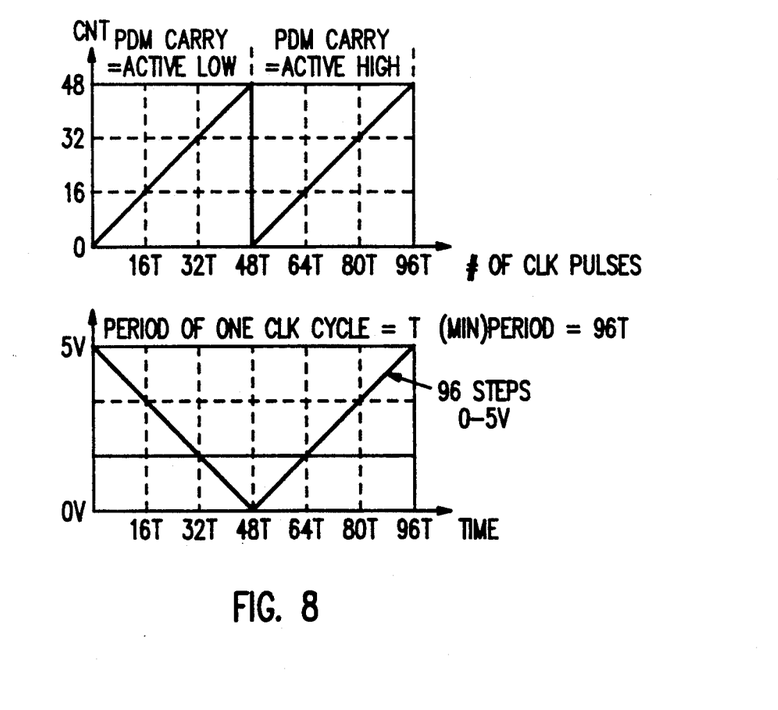
FIG. 8 illustrates how pulse density modulation converts a sawtooth Pattern into a triangular wave.
Figure 9:
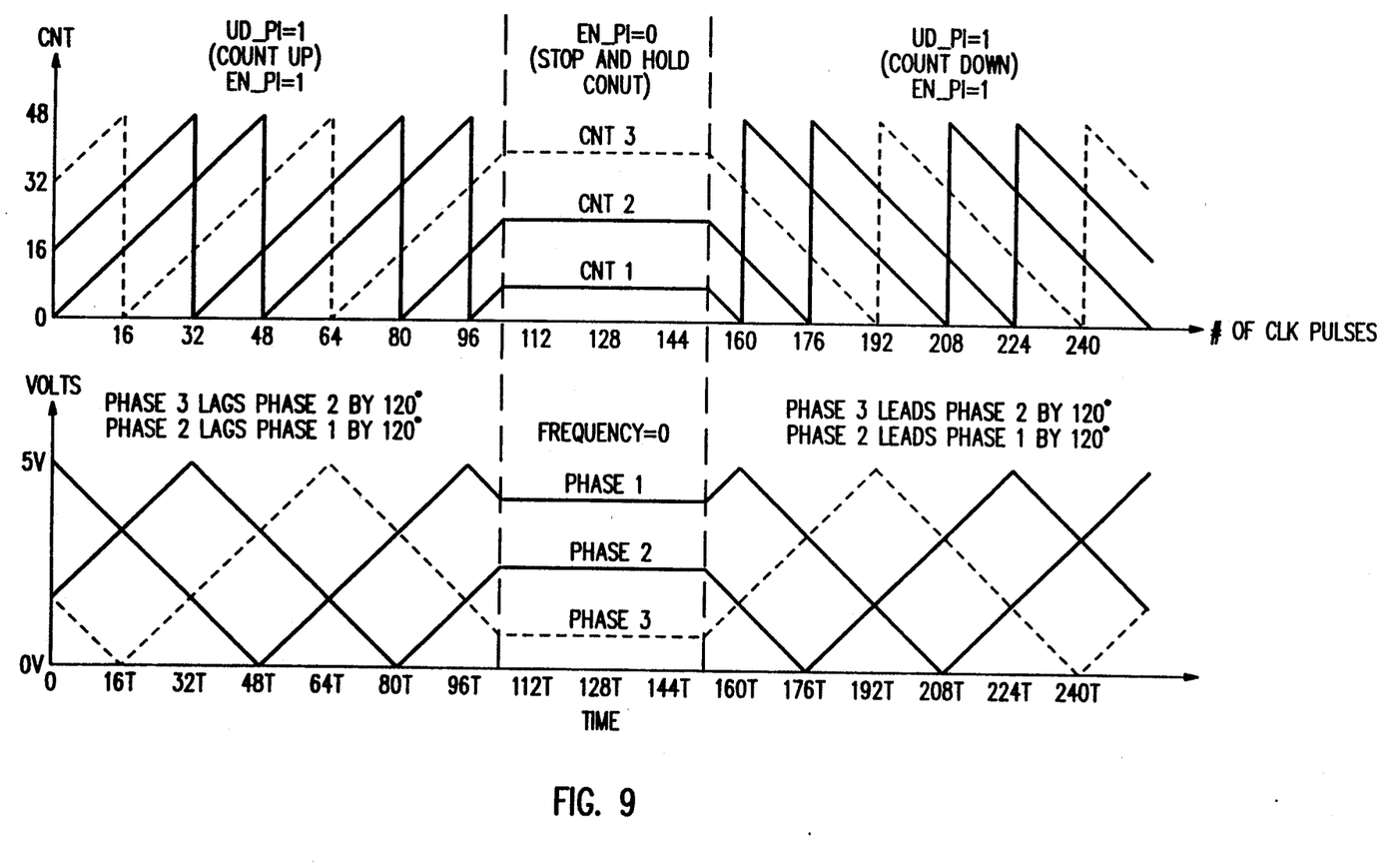
FIG. 9 provides a second illustration of how the sawtooth Pattern is converted into a triangular wave.

FIG. 8 illustrates how a sawtooth digital pattern is converted to a triangular wave using PDM inversion technique. For the case of 3-phase sawtooth patterns using 2-bit MSB and 4-bit common LSB, the triangular outputs can reach a maximum frequency ($f_{max}$) of $CLK/(16 \times 3 \times 2)$ with a horizontal resolution of 96 steps. FIG. 9 is a further example of the conversion of sawtooth digital patterns to triangular waves for both cases of count-up and count-down of counter 21.

Figure 10:
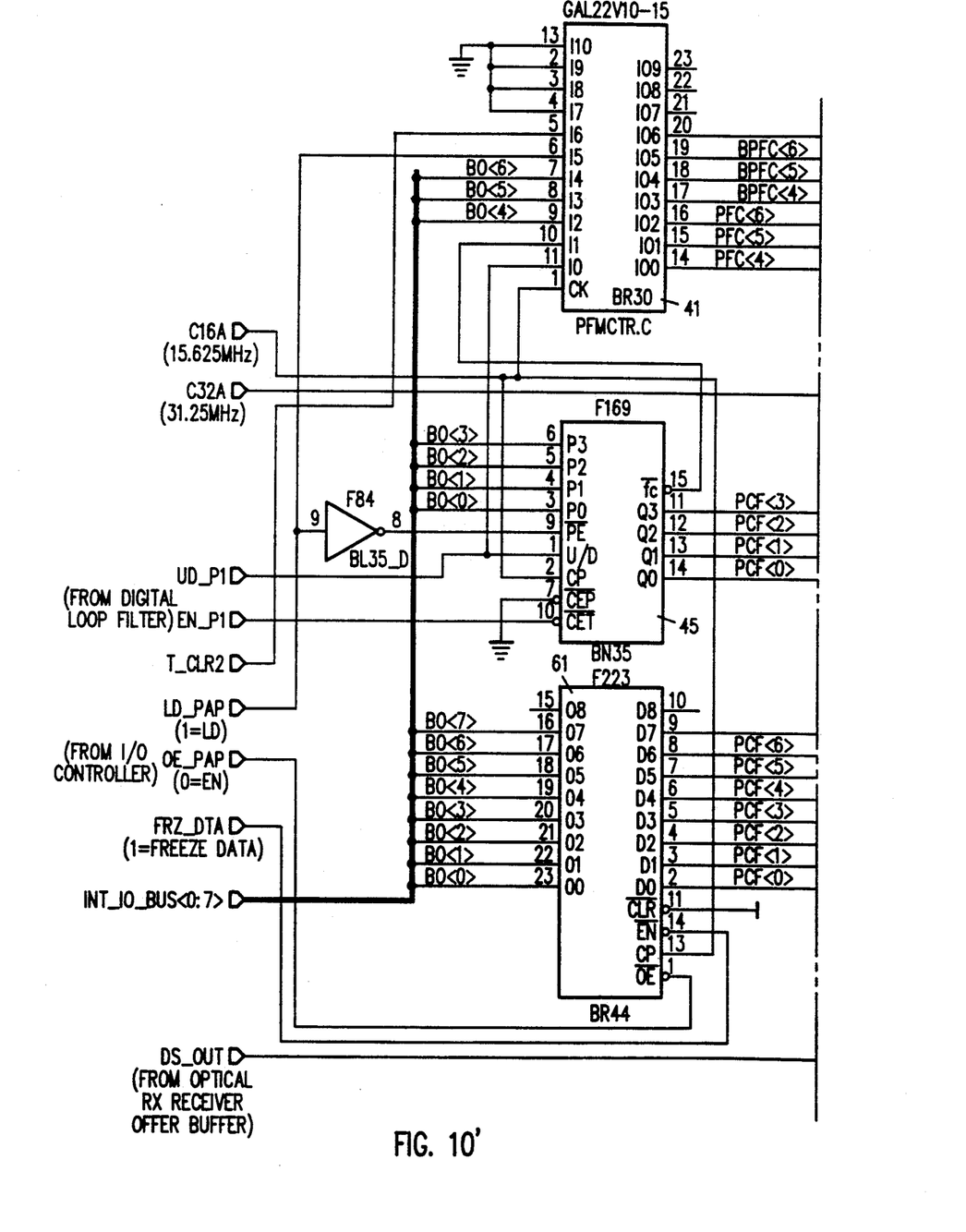
FIG. 10 is a schematic diagram of the preferred embodiment of the present invention.

FIG. 10 is a schematic diagram of a preferred embodiment of P-to-F converter 14 as used in a 250 MHz PLL for a 125 M-bit/sec Fiber Distributed Data Interface (FDDI) system. The PLL frequency is two times the transmission bit rate.

The 3-bit up/down counter for generating HI_CNT of P-to-F counter 21 is implemented with a programmable logic device ('PLD') 41. Binary Up-Down counter 45 generates 4-bit output signal LO_CNT for use by adder 47 and register 49. The 3-Phase MSB waveform generator, sign-bit generators and the three 2-bit MSB PDM circuits are implemented with another PLD 43.

The clock (16A) is a 15,625 MHz clock derived from a 250 MHz crystal oscillator (250 MHz/16) (not shown). The maximum frequency of the 3-Phase outputs is 162.76 KHz (EN_PI=1), thus providing a maximum possible locking range of +651 ppm (250 MHz±162.76 KHz), with a 42 picosecond (1/250MHz×96) average phase resolution for the PLL.

The PDM circuits are clocked by input C32A at 31.25 MHz (2×C16A) to provide wide tolerances for the cut off frequencies of the RC low-pass filters 51, 53, and 55. (162.76 KHz$<f_{-3dB}<$<31.25 MHz). $f_{-3dB}$ of the three RCs are normally much higher than the pole-and-zero frequencies of the PLL's loop filter and should not affect the PLL's loop characteristics. For silicon implementation, the three RC's are matched to ensure similar signal delays among the 3-phase signals.

The 3-Phase PDM carry outputs PDM1, PDM2, and PDM3 are buffered by XOR gates 52, 54 and 56 to ensure that system switching noise will not affect the signal quality of the synthesized outputs.

For debugging purposes, read/write capability is implemented for accessing the contents of the 7 bit P-to-F converter 14 by using data buffer 61 and Int_I-O_$BUS$<0 to 7>. Circuit initialization is not required as the PLD are coded with traps for illegal states.

One possible modification to the present invention is to use 6-phase instead of 3-phase signals for the P-to-F converter. A simple logic inversion of PDM1, PDM2, and PDM3 can be used to drive the three additional 3 Phase signals. Six RC-low pass filters (instead of three) are needed.

The foregoing has been a description of a preferred embodiment of the present invention, and it is apparent that various modifications or substitutions may be affected without departing from the spirit of the invention, which is set forth in the appended claims. In light of the numerous possible modifications the specifications and claims should be interpreted in a broad rather than restrictive sense.

What is claimed is:

1. A signed phase-to-frequency converter for converting a phase error signal, said phase error signal being digital and indicating positive and negative phase errors, into a plurality of frequency signals comprising:
   counting means for counting the positive and negative phase errors, the counting means generating a multi-bit parallel digital signal indicating a cumulative current value of the phase errors;
   digital pattern generator means coupled to the counting means for generating a first multi-phase digital pattern from the multi-bit parallel digital signal;
   first modulation means coupled to the counting means, the first modulation means converting the multi-bit parallel digital signal to a first serial digital signal;
   second modulation means coupled to the first modulation means and the digital pattern generator means, the second modulation means combining the first serial digital signal and the first multi-phase digital pattern to form a plurality of second serial digital signals; and
   output means coupled to the second modulation means for converting the plurality of second serial digital signals to an analog multiphase output signal.

2. The converter of claim 1 wherein the first modulation means further comprises:
   an adding means coupled to the counting means; and
   a register means coupled to the adding means and the second modulation means, the register means storing a result from the adding means and transmitting to the adding means a predefined number of least significant bits of the result for iterative addition by the adding means and transmitting to the second modulation means a highest order bit in the result for use as the first serial digital signal.

3. The converter of claim 2 wherein the digital pattern generator generates a three-phase sawtooth digital pattern.

4. The converter of claim 1 wherein the output means comprises a plurality of resistor-capacitor filter means, one filter means being used for each of said plurality of second serial digital signals.

5. A method for converting a leading and lagging phase error signal, the phase error signal being digital and indicating by step-wise positive and negative steps the degree of leading and lagging phase error, to a multi-phase pulse density modulated signal, the method comprising the steps of:

counting the step-wise positive and negative steps of the phase signal and generating a cumulative multi-bit counting output signal;

converting a first predefined number of least significant bits of the multi-bit counting output signal to a first serial digital output signal;

converting a predefined number of most significant bits of the multi-bit counting output signal to a first multi-phase digital pattern;

combining the first multi-phase digital pattern and the first serial digital output signal to form a plurality of second serial digital signals; and converting said plurality of second serial digital signals to an analog multiphase frequency modulated signal.

6. The method of claim 5 wherein the step of converting the predefined number of least significant bits of the multi-bit counting output signal to a first serial digital output signal further comprises the steps of:

adding the first predefined number of least significant bits and a second predefined number of bits, the second predefined number and the first predefined number being equal, to produce a result having at least one more bit than the first or second predefined number;

storing the stored results of the adding step;

using a number of least significant bits of the stored results as the second predefined number; and using the at least one bit in the result that is more than the predefined number as the serial digital output signal.

* * * * *